United States Patent
Chang

(10) Patent No.: US 8,570,789 B2
(45) Date of Patent: Oct. 29, 2013

(54) SRAM TIMING TRACKING CIRCUIT

(75) Inventor: Feng-Ming Chang, Chiayi (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 137 days.

(21) Appl. No.: 13/334,674

(22) Filed: Dec. 22, 2011

(65) Prior Publication Data

US 2013/0163312 A1 Jun. 27, 2013

(51) Int. Cl.
*G11C 11/00* (2006.01)

(52) U.S. Cl.
USPC .... 365/154; 365/138; 365/188; 365/189.011; 365/189.16; 365/189.06; 365/189.08; 365/201

(58) Field of Classification Search
USPC ............ 365/138, 154, 188, 189.011, 189.16, 365/189.06, 189.08, 201
See application file for complete search history.

(56) References Cited

U.S. PATENT DOCUMENTS

| | | | |
|---|---|---|---|
| 6,975,532 B1 | 12/2005 | Kosonocky et al. | |
| 7,177,177 B2 | 2/2007 | Chuang et al. | |
| 7,898,894 B2 | 3/2011 | Chang et al. | |
| 2011/0182112 A1 | 7/2011 | Houston | |

OTHER PUBLICATIONS

Lin, S. et al., "A Low Leakage 9T SRAM Cell for Ultra-Low Power Operation", GLSVLSI 2008 Proceedings of the 18th ACM Great Lakes Symposium on VLSI, 4 pages.
Lai, Y.C. et al., "Robust SRAM Design via BIST-Assisted Timing-Tracking (BATT)", IEEE Journal of Solid-State Circuits, Feb. 2009, 44(2):642-649.

*Primary Examiner* — Fernando Hidalgo
(74) *Attorney, Agent, or Firm* — Duane Morris LLP

(57) ABSTRACT

A static random access memory (SRAM) test apparatus includes an array of SRAM test cells. The test cells are configured according to a layout with NMOS and PMOS transistors coupleable as inverters and responsive to a first passing gate transistor. At least one of the NMOS and PMOS transistors of a test cell at a predetermined location in the array is coupled to a fixed voltage to force a logic state of an associated inverter. A switching signal coupled to the associated inverter through a second passing gate transistor produces a detectable test current through one of the NMOS and PMOS transistors of the associated inverter of said test cell and through one of the NMOS and PMOS transistors of an associated inverter of an adjacent series-connected test cell.

20 Claims, 16 Drawing Sheets

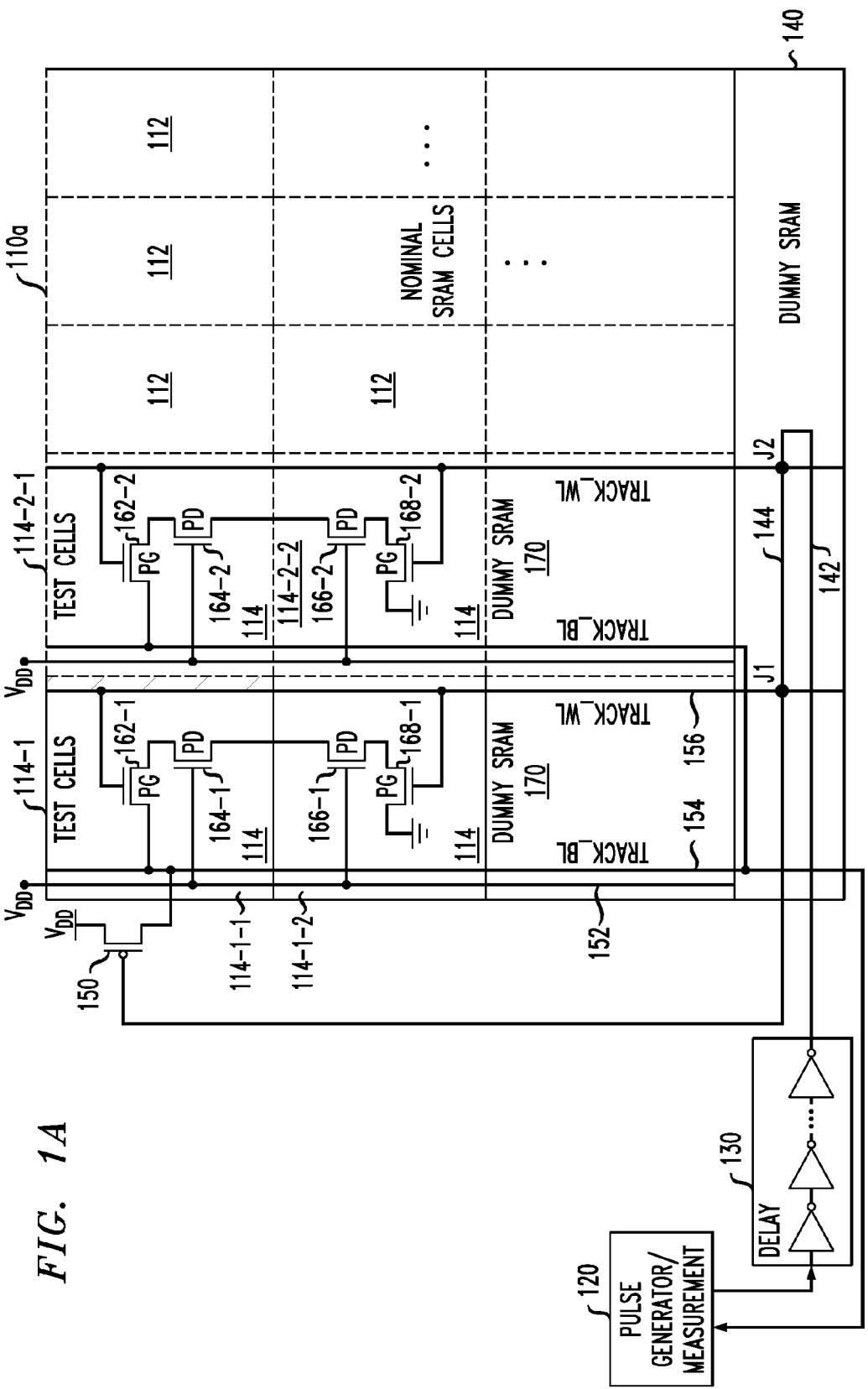

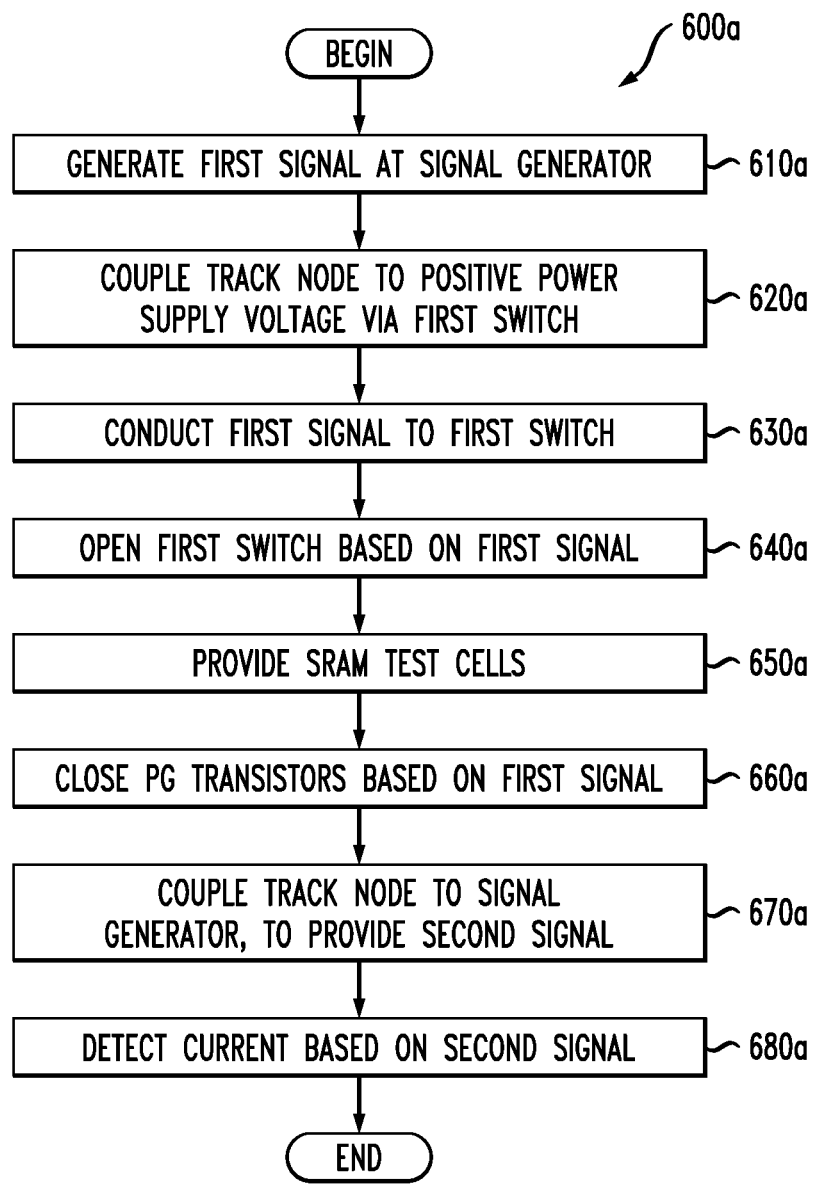

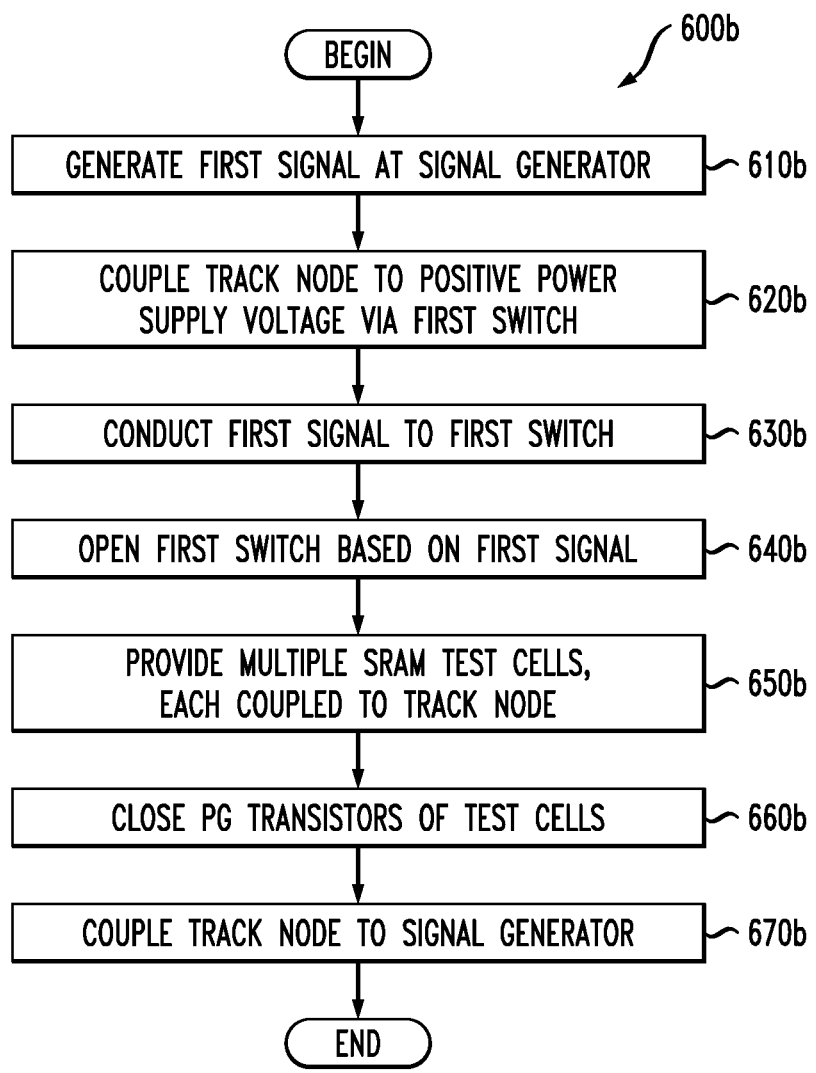

FIG. 13
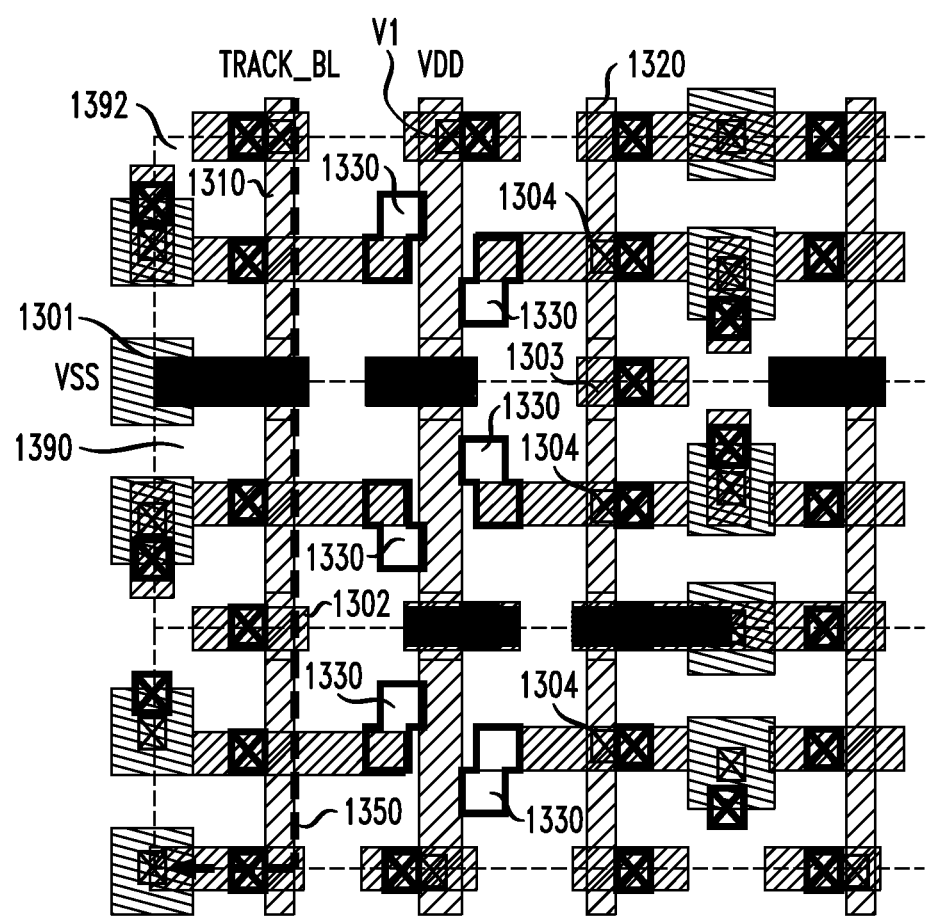
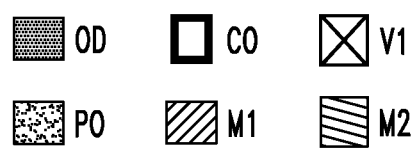

FIG. 14
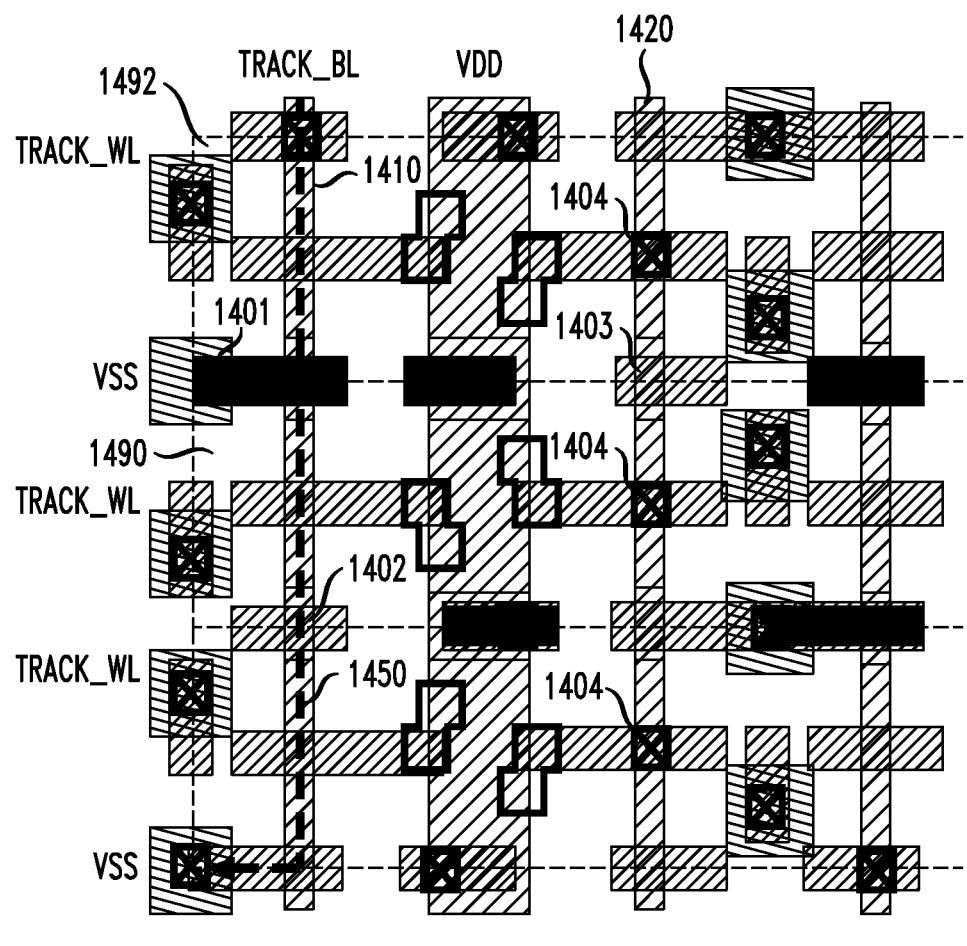
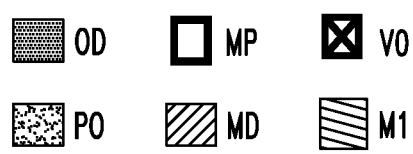

SRAM TIMING TRACKING CIRCUIT

BACKGROUND

Static random access memory (SRAM) is a type of volatile semiconductor memory that stores data bits using bistable circuitry that does not need refreshing. An SRAM cell may be referred to as a bit cell because it stores one bit of information, represented by the logic state of two cross coupled inverters. Memory arrays include multiple bit cells arranged in rows and columns. Each bit cell in a memory array typically includes connections to a power supply voltage and to a reference voltage. Logic signals on bit lines control reading from and writing to a bit cell, with a word line controlling connections of the bit lines to the inverters, which otherwise float. A word line may be coupled to the bit cells in a row of a memory array, with different word lines provided for different rows.

Each successive bit cell along a bit line or word line has a characteristic input capacitance, and each conductor leg between bit cells has a resistance, leading to a signal propagation delay. The delay is longer for bit cells that are farther than others along signal paths beginning at the source of memory addressing and control signals, such as the outputs of address decoding gates and line drivers coupled at an edge of the memory array. The delay affects the time needed to access the bit cells and limits the highest frequency at which the memory can be operated. The time taken to access an SRAM bit cell, e.g., for a read operation, may vary due to several factors including the relative position of the accessed bit cell within the SRAM array, and also including variation in the operational characteristics of SRAM components such as transistors in bit cells, the latter typically being a result of variations in the semiconductor production process as opposed to bit cell location. Reliable estimation of SRAM timing characteristics is important for ensuring consistency in system components and high system performance.

SUMMARY

In an embodiment disclosed herein, a static random access memory (SRAM) test apparatus includes an array of SRAM test cells. The test cells are configured according to a layout with NMOS and PMOS transistors coupled or coupleable to form inverters and responsive to a first passing gate transistor. At least one of the NMOS and PMOS transistors of a test cell at a predetermined location in the array is coupled to a fixed voltage to force a logic state of an associated inverter. A switching signal coupled to the associated inverter through a second passing gate transistor produces a detectable test current through one of the NMOS and PMOS transistors of the associated inverter of said test cell and through one of the NMOS and PMOS transistors of an associated inverter of an adjacent series-connected test cell.

In an embodiment, a static random access memory (SRAM) test apparatus includes an array of SRAM test cells. The test cells are configured according to a layout with NMOS and PMOS transistors coupleable as inverters and responsive to a first passing gate transistor. At least one of the NMOS and PMOS transistors of a first test cell at a predetermined location in the array is coupled to a fixed voltage to force a logic state of an associated inverter. A switching signal coupled to the associated inverter through a second passing gate transistor produces a detectable test current having a first component through one of the NMOS and PMOS transistors of the associated inverter of said test cell, and a second component through one of the NMOS and PMOS transistors of an associated inverter of a second test cell adjacent to the first test cell in the array.

A method for configuring a test apparatus includes generating a first signal at a test signal generator, coupling a track node to a positive power supply voltage via a first switch, and conducting the first signal to the first switch. The first switch is opened, based on the first signal, to decouple the track node from the positive power supply voltage. The method includes providing a plurality of static random access memory (SRAM) test cells arranged in at least two rows and at least one column. Each test cell includes a first transistor (PG), a second transistor (PU), and a third transistor (PD). A gate of one of the PU and PD transistors of each test cell is coupled to a fixed voltage to force said one transistor into a conducting state, and at least two of the test cells are connected in series. The PG transistors of the series-connected test cells are closed, based on the first signal, to couple the track node to a ground node via an electrical path through the series-connected test cells. The track node is coupled to the signal generator, to provide a second signal to the pulse generator, and a current in said one transistor is detected based on the second signal.

In an embodiment, a first signal is generated at a test signal generator. A track node is coupled to a positive power supply voltage via a first switch, and the first signal is conducted to the first switch. The first switch is opened, based on the first signal, to decouple the track node from the positive power supply voltage. Multiple static random access memory (SRAM) test cells are provided. The test cells are coupled in parallel with one another. Each test cell is coupled to the track node and includes a first transistor (PG), a second transistor (PU), and a third transistor (PD). A gate of one of the PU and PD transistors of each test cell is coupled to a fixed voltage to force said one transistor into a conducting state. The PG transistors of the test cells are closed, based on the first signal, to conduct current from the track node through a predetermined one of the PU and PD transistors in each of the test cells. The track node is coupled to the signal generator, to provide a second signal to the pulse generator.

BRIEF DESCRIPTION OF THE DRAWINGS

The following will be apparent from elements of the figures, which are provided for illustrative purposes and are not necessarily to scale.

FIG. 1A is a schematic diagram of an SRAM timing tracking apparatus in accordance with an exemplary embodiment, with SRAM test cells in multiple columns of an SRAM array.

FIG. 6A is a flow diagram of a process in accordance with an exemplary embodiment.

FIG. 6B is a flow diagram of a process in accordance with an exemplary embodiment.

FIG. 13 is a top view (plan view) of a cell layout in accordance with an exemplary embodiment, with the orientation rotated 180 degrees relative to that of FIG. 7.

FIG. 14 is a top view (plan view) of another cell layout in accordance with an exemplary embodiment, with the orientation rotated 180 degrees relative to that of FIG. 7.

DETAILED DESCRIPTION

This description of certain exemplary embodiments is intended to be read in connection with the accompanying drawings, which are to be considered part of the entire written description.

Various embodiments of the present disclosure provide timing tracking functionality for accurate, efficient monitoring of static random access memory (SRAM) specific variation. Timing tracking enables determination of when a bit cell finishes a read or write operation. Timing tracking circuitry is implemented in various embodiments within an existing SRAM, i.e., using the SRAM array of bit cells itself, or with a timing tracking circuit separate from the SRAM but made by the same production process.

FIG. 1A is a schematic diagram of an SRAM timing tracking apparatus in accordance with an exemplary embodiment. FIG. 1A shows a configuration in which a timing tracking circuit is configured within a functional SRAM array itself, obviating the need for a separate, stand-alone timing tracking circuit. Multiple SRAM bit cells are arranged in an SRAM array 110a. Nominal bit cells are arranged in a pattern having multiple word lines and bit lines coupled to rows and columns of bit cells such that when a word line and a bit line are active, they select the bit cell at the point where the word lines and bit lines cross. According to the present embodiments, certain word lines and bit lines are enlisted to serve other functions in connection with testing operational delays.

Figure 1B:
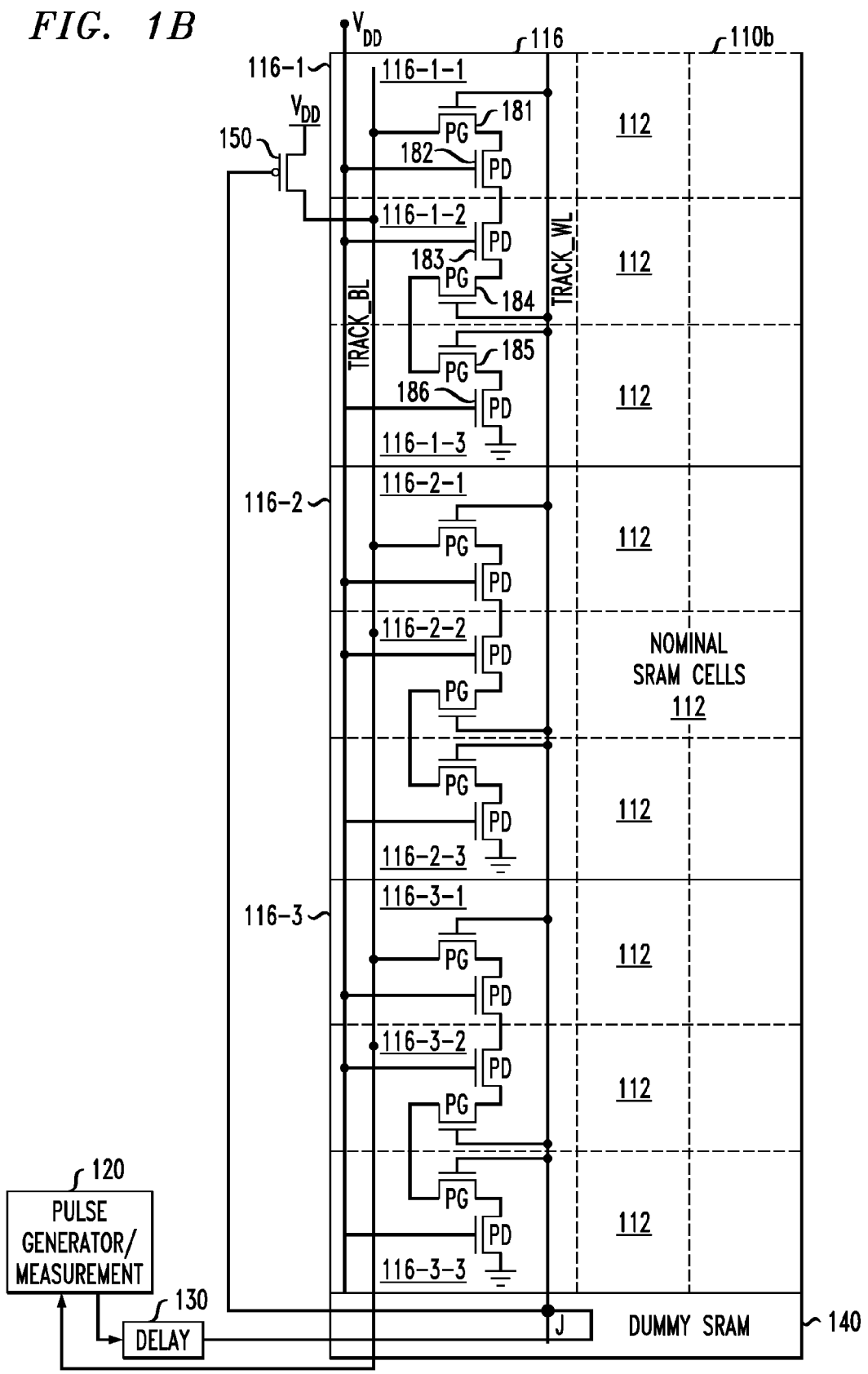
FIG. 1B is a schematic diagram of an SRAM timing tracking apparatus in accordance with an exemplary embodiment, with SRAM test cells in a single column of an SRAM array.
Figure 2:
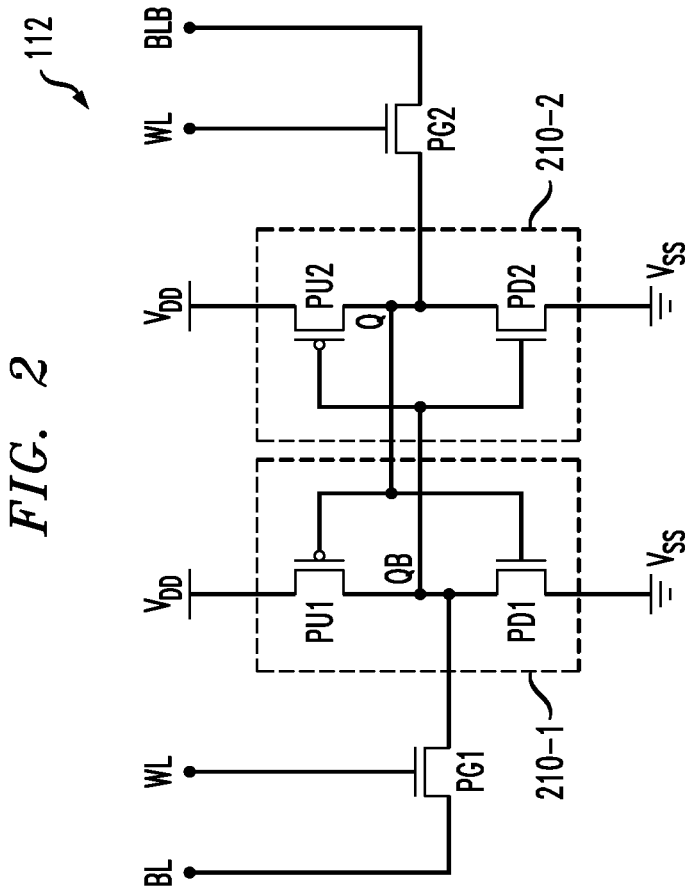
FIG. 2 is a schematic diagram of a nominal SRAM bit cell in accordance with an exemplary embodiment

The word lines and bit lines are described in greater detail in the context of FIG. 2. A given bit cell is selected by concurrently activating a word line and a bit line coupled to the given cell. In the configuration shown in FIG. 1A, a subset of the SRAM cells are adapted for timing tracking, so that a separate timing tracking circuit external to an SRAM array is not needed to emulate the array. In an embodiment shown in FIG. 1A, SRAM cells that provide normal SRAM functionality, including storage of data bits and read and write operations, are referred to as nominal cells 112. A subset of the SRAM cells are enlisted, or re-purposed, for timing tracking and are referred to as test cells 114. Two columns of test cells 114-1 and 114-2 are shown in FIG. 1A, although various numbers of columns of test cells, may be used. Test cells 114-1-1 and 114-1-2 are shown in column 114-1, and test cells 114-2-1 and 114-2-2 are shown in column 114-2. The test cells 114 do not function as the nominal SRAM cells do in terms of storing data and supporting read/write operations. Rather, the test cells are bit cells with fixed logic values configured and coupled to one another so as to respond in a predictable way when addressed by test or tracking signals. Various bit lines that are otherwise used in a nominal bit cell configuration for addressing cells in the case of the nominal cells, are enlisted for other purposes in the case of the test cells. Three such enlisted bit lines are shown in FIG. 1A: bit line 152 is enlisted to be coupled (tied) to a fixed voltage denoted $V_{TIED}$, which may be a positive power supply voltage $V_{DD}$; and bit lines 154 and 156 are enlisted to conduct signals TRACK_BL and TRACK_WL, respectively, and those signals are detailed in the following discussion. For graphical convenience, in FIG. 1A these enlisted bit lines are only designated with reference characters in column 114-1.

A test signal generator 120, which may be a pulse generator, generates a word line signal. The pulse generator 120 may also provide measurement functionality for measuring the time delay until detection of a return signal described below, e.g., by commencing a timing operation when generating the signal and completing the timing operation when detecting the return signal, namely a current conducted at the test cells. An optional delay chain 130, which may include a string of inverters or other delay elements, provides a fixed basic delay in case it is convenient to insert a delay so as to move ahead the measurement window in which the tracking delay will be discerned. After the optional delay, the word line signal is applied to cells in a region of the SRAM array 110a designated dummy SRAM 140. In the example shown in FIG. 1A, existing word lines 142 and 144 of the SRAM 110a are enlisted to convey the signal for timing tracking purposes. Thus, word lines 142 and 144 are disabled from addressing bit cells in the corresponding rows of the SRAM and are used as vehicles to transport a signal for another purpose. In this example, the signal is transported along conductor 142 about halfway across a row of the SRAM array, and then is transported back along conductor 144 to columns 114-1 and 114-2 of the array, at respective junctions J1 and J2. This topology, in which the path taken by the word line signal up to junction J has a hairpin shape, models a case in which a bit cell in the last (rightmost in FIG. 1A) column would be accessed, e.g., for a read operation. In other words, the length of the path along conductors 142 and 144 up to junction J1 and/or J2 may be approximately equal to the width of the SRAM array (distance across a row from one edge of the array to the other, according to the orientation of the array in FIG. 1A). This routing along conductors 142 and 144, substantially halfway across and then back, emulates the signal routing delay in a functional SRAM array for a read or write operation at the far edge. Other shapes and lengths for the path from delay block 130 to junctions J1 and J2 may be used in other examples.

The word line signal is conducted from junction J1 to test cells 114-1-1 and 114-1-2, and from junction J2 to test cells 114-2-1 and 114-2-2, along vertical paths in the example of FIG. 1A. These vertical paths include enlisted bit lines marked TRACK_WL, which are enlisted for tracking propagation times and which are disabled from addressing an SRAM cell. The sum of the lengths of the paths to J1 and/or J2 and from there to test cells 114 may be such that the metal routing delay for accessing a cell at the top right corner of array 110a is emulated, namely the delay from signal entry at the bottom left, propagating horizontally and vertically, over a path distance equal to the length of a path from one corner to the diagonally opposite corner.

Enlisted bit line TRACK_BL in column 114-1 is coupled to a positive power supply voltage $V_{DD}$ by a switch when the switch is in the closed state. The switch may be a PMOS transistor 150 as shown in FIG. 1A. Thus, TRACK_BL is pre-charged to a logical high voltage value. The gate of transistor 150 is coupled to conductor 144 to conduct the word line signal to the transistor, to turn off the transistor (open the switch), thereby decoupling TRACK_BL from $V_{DD}$. In test cell 114-1-1, NMOS transistor 162-1 is turned on by provision of the word line signal on enlisted bit line TRACK_WL to the gate of the transistor. NMOS transistor 164-1 is maintained in an "on" state by the coupling of the gate of that transistor to enlisted bit line 152, which is coupled to fixed voltage $V_{TIED}$, which may be a logical high voltage such as $V_{DD}$. Thus, the switch provided by transistor 162-1 is closed to enable current to flow from TRACK_BL through transistors 162-1 and 164-1. Transistors 162-1 and 164-1 are labeled PG and PD, which stand for passing gate and pull-down, respectively, which terms are discussed further in the context of FIG. 2.

At test cell 114-1-2, a gate of NMOS transistor 166-1 is tied to the fixed voltage $V_{TIED}$. A gate of NMOS transistor 168-1 is coupled to TRACK_WL. Test cells 114-1-1 and 114-1-2 are coupled in series by coupling respective terminals of transistors 164-1 and 166-1. Thus, when TRACK_BL is decoupled from $V_{DD}$, TRACK_WL controls transistors 162-1 and 168-1 to enable current to flow from TRACK_BL to ground through series-connected test cells 114-1-1 and 114-1-2.

Test cells 114-2-1 and 114-2-2 in column 114-2 are configured similarly as the test cells in column 114-1, with transistors 162-2 and 164-2 in test cell 114-2-1, and transistors 166-2 and 168-2 in test cell 114-2-2. NMOS transistors 164-2 and 166-2 are tied high. NMOS transistors 162-2 and 168-2 are coupled to the enlisted bit line in column 114-2 marked TRACK_WL so that they, like transistors 162-1 and 168-1, function as closed switches (are turned on to conduct current) when the TRACK_WL signal is asserted. TRACK_BL in column 114-1 is coupled to TRACK_BL in column 114-2. This coupling may be achieved by connection in dummy SRAM region 140 as shown in FIG. 1A, or by connection in dummy SRAM region 170, or by connection in the test cells. Alternatively, a single vertical TRACK_BL path may be provided at one column, with suitable couplings at the test cells to couple both transistors 162-1 and 162-2 to TRACK_BL. Regardless of the manner in which such coupling is achieved, the effect is to provide a shunt such that a fraction of the current (e.g., ½, if there are two columns) flows from TRACK_BL (originally pre-charged high) to ground through a path in column 114-1 and a fraction of the current flows from TRACK_BL to ground through a path in column 114-2.

Thus, current from TRACK_BL is shunted across first and second columns, where "first" and "second" are meant to denote identify distinct columns and do not necessarily mean first and second in a spatial sense.

Thus, when transistor 150 is turned off, the formerly high voltage at TRACK_BL discharges to ground, and the pulled-low TRACK_BL is coupled to pulse generator 120, so that the pulled-down signal on TRACK_BL (asserted low) that arrives at the measurement unit (also denoted as 120) may be measured for timing tracking, as the read operation emulated in the functional SRAM (e.g., nominal cells 112) has been completed.

In this timing tracking configuration, most of the cells in the SRAM array are unaltered from their normal SRAM configuration and are nominal cells. Because word line conductors 142 and 144 are enlisted to convey a word line signal for timing tracking purposes, those conductors are disabled from addressing bit cells in their respective rows in the usual SRAM manner, so those rows are effectively disabled from normal SRAM functionality and are labeled dummy SRAM cells 140 in FIG. 1A. Similarly, because enlisted bit lines 152, 154, and 156 are re-purposed to support timing tracking functionality at test cells 114-1-1 and 114-1-2 as described above, those bit lines are disabled from addressing bit cells in their corresponding columns in the usual SRAM manner. Thus, other bit cells in columns 114-1 and 114-2 are denoted dummy SRAM cells 170. Dummy cells 140 and 170 enable the capacitive and resistive environment to be matched closely for accurate modeling of the environment for nominal bit cells. Bit lines that are tracked typically have two factors that determine propagation delay of signals that are carried, namely serial resistance and parallel capacitance. Dummy cells have real capacitive load, and mimic the capacitance of unenlisted bit lines in nominal cells. If dummy cells were not provided, the length of enlisted bit lines would effectively appear to be shorter that the lines they are intended to emulate, which would decrease resistance and capacitance, and which might lead tracking circuitry to determine that read or write operations have concluded prematurely. Dummy cells 140 and 170 also fill out the array.

FIG. 1B is a schematic diagram of an SRAM timing tracking apparatus in accordance with an exemplary embodiment, with SRAM test cells in a single column of an SRAM array. Although the column having the test cells is shown as a leftmost (edge) column in FIG. 1B, that configuration is for illustrative purposes only. Test cells may be in the interior of an SRAM cell array in some embodiments. As in FIG. 1A, the apparatus in FIG. 1B sends a word line signal from pulse generator 120 and detects the arrival of a pulled down TRACK_BL signal for timing tracking.

SRAM array 110*b* in FIG. 1B, like array 110*a* in FIG. 1A, includes nominal cells and test cells that have certain components enlisted for timing tracking purposes. Test cells in column 116 are arranged in multiple test cell groups, including groups 116-1, 116-2, and 116-3. Each test cell group includes multiple test cells. Group 116-1 includes test cells 116-1-1, 116-1-2, and 116-1-3; group 116-2 includes test cells 116-2-1, 116-2-2, and 116-2-3; and group 116-3 includes test cells 116-3-1, 116-3-2, and 116-3-3. Test cell 116-1-1 includes NMOS transistor 181, which is coupled to TRACK_BL and which has a gate coupled to TRACK_WL. NMOS transistors 182 and 183, and 186 are forced closed by tying their gates to $V_{DD}$. NMOS transistors 184 and 185 are controlled by TRACK_WL. The test cells in group 116-1 are connected in series by coupling respective source/drain terminals of transistors 182 and 183, and of transistors 184 and 185. Although three test cells are coupled in series in this example, various numbers of test cells may be coupled in series. Each test cell includes a PG and a PD transistor. PD transistors are tied high to force them closed, and PG transistors have their respective gates coupled to TRACK_WL. Each interface between adjacent series-connected test cells includes two PG or two PD transistors, with PD-PD at one interface, PG-PG at the next, and so on in alternating fashion. The last test cell in the series path has a transistor coupled to ground, so that a path from TRACK_BL to ground is provided.

Test cell groups 116-2 and 116-3 are similar to group 116-1. The test cell groups are coupled in parallel due to common coupling to a terminal of transistor 150 as shown. Thus, current from TRACK_BL flows through paths in the respective test cell groups. In this example, with three test cell groups, ⅓ of the overall test current flows through each group.

The apparatuses in FIGS. 1A and 1B both provide a series path for a test current. They also both provide a shunt: in FIG.

1A, the current from TRACK_BL is shunted across multiple columns, and in FIG. 1B, the shunt is across multiple test cell groups in a single column. In FIG. 1B, a shunt may be provided across multiple columns as well as the shunt shown across multiple test cell groups. The configuration of FIGS. 1A and 3 tracks a cell current by using four test bit cells for tracking, in two columns. The configuration of FIG. 1B tracks a cell current by using nine test cells for tracking in one column. In either case, using multiple test cells for tracking a cell current advantageously provides better emulation of SRAM timing characteristics than past known techniques. If a single test cell is used to track a test current, the tracked cell current might be an outlier with characteristics that are not typical of other cells. Device variation is a motivating factors for SRAM timing emulation. Bit cells may vary from one to the next in terms of a cell current vs. threshold voltage ($V_t$) relationship, for example. Tracking a cell current using multiple test cells increases accuracy of emulation by reducing the likelihood that resulting emulation results are outliers. In other words, at least some effects of device variation are averaged according to the embodiments shown, over the multiple test cells used for tracking, e.g., in a series-connected path.

Providing a shunt in various embodiments causes a fraction of a cell current (e.g., 1/N if there are N parallel paths due to the shunt) to flow through each of various cells, rather than a whole cell current as in a known approach. Accordingly, the problem of an insufficient delay time that has negative impacts on performance tracking is avoided in some embodiments. In practice, the total cell current will be less than the sum of the individual fractional parts along respective paths provided by the shunt, due to body effects that occur when there is a potential difference between MOSFET source and bulk terminals. Body effects may increase the threshold voltage of a transistor and reduce the conduction current. If the conduction current difference between a tracking circuit and an SRAM that is being emulated is a fixed value, the tracking circuit provides adequate precision for timing tracking Body effects can be compensated for by using additional test cells in parallel. For a series path from TRACK_BL to ground, various numbers of series-connected cells may be used. Testing indicates that about three to seven cells in series improves the balance of cell current degradation and the number of sampled test cells.

FIG. 2 is a schematic diagram of a nominal SRAM bit cell 112 in accordance with an exemplary embodiment. The structure and function of bit cell 112 is known to one of ordinary skill. Bit cell 112 includes a pair of access transistors PG1 and PG2 biased by a word line WL and providing access to cross-coupled inverters 210-1 and 210-2, respectively. "PG" in PG1 and PG2 may stand for "passing gate" because they pass signals on the bit lines to the nodes of the cross coupled inverters when the word line signal at the gate terminal of transistors PG becomes true. Inverter 210-1 includes a pull-up PMOS transistor PU1 and a pull-down NMOS transistor PD1, and inverter 210-2 includes a pull-up PMOS transistor PU2 and a pull-down NMOS transistor PD2. Transistors PG1 and PG2 respectively are coupled to a first bit line BL ("bit line") and to a second bit line BLB ("bit line bar" or bit line complement). This configuration is referred to as a 6T (six-transistor) configuration. During standby mode, WL is not asserted, and the access transistors PG1 and PG2 disconnect the bit cell from the bit lines. The cross-coupled inverters are coupled to the power supply and reinforce each other to maintain one of two possible logic states with a stored data bit at one of the nodes between the inverters (node Q) and the complement of that bit at the other node between the inverters (node QB). For a read operation, BL and BLB are precharged high, and WL is asserted. The stored data bit at node Q is transferred to BL, and the data bit at node QB is transferred to BLB. For a write operation, the value to be written is provided at BL, and the complement of that value is provided at BLB, when WL is asserted.

Although SRAM 6T cells have been described above, other types of memory cells may be used as well, including types of memory other than SRAM and other types of SRAM configurations than 6T, e.g., eight transistor (8T) or ten transistor (10T) configurations. In such memory types or configurations: (1) a transistor in at least one storage node is maintained in a conductive (or nonconductive) condition characteristic of its condition in a predetermined logic state (e.g., forced to a condition representing logic high) and used as a test cell, the transistor being switched to the opposite conductive (or nonconductive) condition by a timing test signal along a route otherwise used in the array layout as a bit line in a nominal cell; (2) a word line similarly is decoupled from a normal (nominal) cell array and is coupled to a conductive route (originally used as a bit line in an adjacent nominal cell) to carry a track WL signal; and (3) when the track WL turns on the transistor (such as a PG transistor and a PD transistor of a test cell in an SRAM example), a current from track BL to Vss is generated and can be detected to stop and/or read a timer that was started when the timing test signal was generated. In this way, the representative time delay to and from the test cell provides a measure from which the delays along other paths are inferred, e.g., in an SRAM. Timing tracking methods and circuits as described above can also be applied to 8T and 10T configurations such as those disclosed in the following patents and publications, which are incorporated by reference herein in their entireties: U.S. Pat. Pub. 2011/0182112 entitled "10T SRAM cell with near dual port functionality" to Houston; U.S. Pat. No. 6,975,532 entitled "Quasi-static random access memory" to Kosonocky et al.; U.S. Pat. No. 7,898,894 entitled "Static random access memory (SRAM) cells" to Chang et al.; U.S. Pat. No. 7,177,177 entitled "Back-gate controlled read SRAM cell" to Chuang et al.; and "A Low Leakage 9T SRAM Cell for Ultra-Low Power Operation" by Lin et al., GLSVLSI'08, May 4-6, 2008, Orlando, Fla., ACM 978-1-59593-999-9/08/05.

Figure 3:
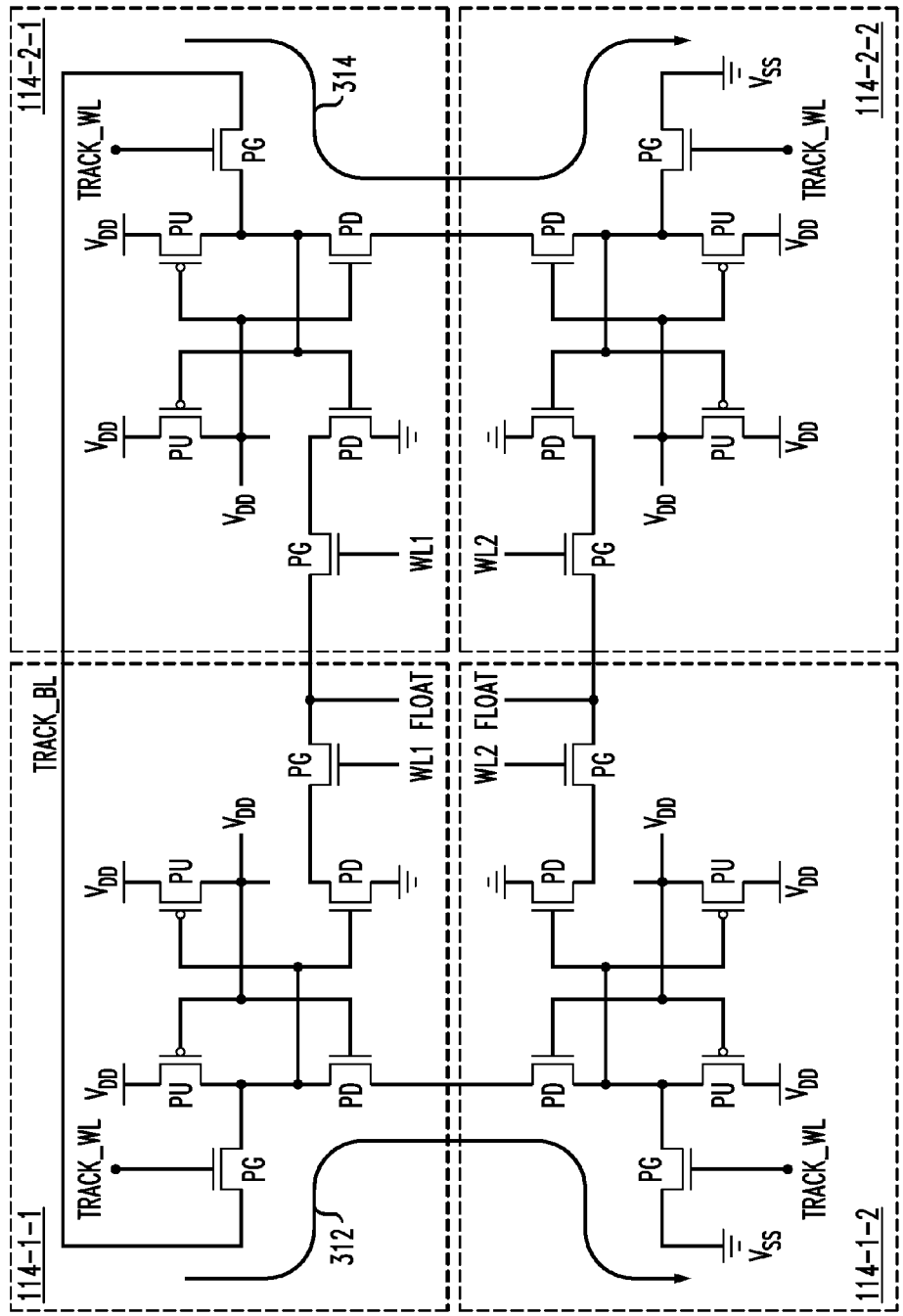
FIG. 3 is a schematic diagram that provides additional details for test cells of FIG. 1, in accordance with an exemplary embodiment.

FIG. 3 is a schematic diagram that provides additional details for test cells of FIG. 1, in accordance with an exemplary embodiment. Additional detail for test cells 114-1-1, 114-1-2, 114-2-1, and 114-2-2 is shown in FIG. 3. Each test cell in FIG. 3 may be similar to a nominal test cell in the 6T configuration as shown in FIG. 2 but with modifications that enlist certain components for timing tracking functionality, i.e., that re-purpose the test cells. As shown, each test cell may include two PG transistors, two PU transistors, and two PD transistors. Test cells 114-1-1 and 114-2-1 share TRACK_BL, and the effect of the shunt is that current from TRACK_BL flows through two paths: path 312 and path 314. A fractional part of the overall current flows through each path. If there are M columns, the fraction is 1/M for each column. Although each path in FIG. 3 is shown as including a PD transistor in each test cell in the path, a PU transistor may be used instead in another embodiment. This may be achieved by tying a node to ground instead of to $V_{DD}$, which forces a PMOS PU transistor into the closed state.

Each test cell in FIG. 3 includes a PG transistor that is coupled to a floating node, as denoted by FLOAT, and that has a gate coupled to a corresponding word line, as denoted by WL1 and WL2. Those word lines are disabled from accessing the test cells due to the floating node coupled to the corresponding PG transistors. The floating node in each column may be implemented by enlisting a bit line or segments of a bit line to be electrically floating. In FIG. 3, for each cell the respective drain terminals of the transistors of the one of the PU-PD pairs are shown as being disconnected. For example, in cell 114-1-1, the PU-PD pair at right does not have drain terminals connected to one another. Such disconnection may prevent current from flowing from $V_{DD}$ (that ties a node high to force the state of an inverter formed by the PU-PD pair at left) through the PG transistor at right in cell 114-1-1 to a bit line when WL1 has a logical high value. In other embodiments, the drain terminals of the PU-PD pair at right in cell 114-1-1 are connected to one another (and similar connections are present in other test cells). Enlisting a bit line to be electrically floating (as shown by FLOAT in FIG. 3) prevents creation of a DC leakage path. Alternatively, if the bit line is not be configured to be floating, a gate of a PG transistor (e.g., WL1 that biases the PG transistor at right in cell 114-1-1 of FIG. 3) may be tied to ground to cut off the leakage path.

Figure 4:
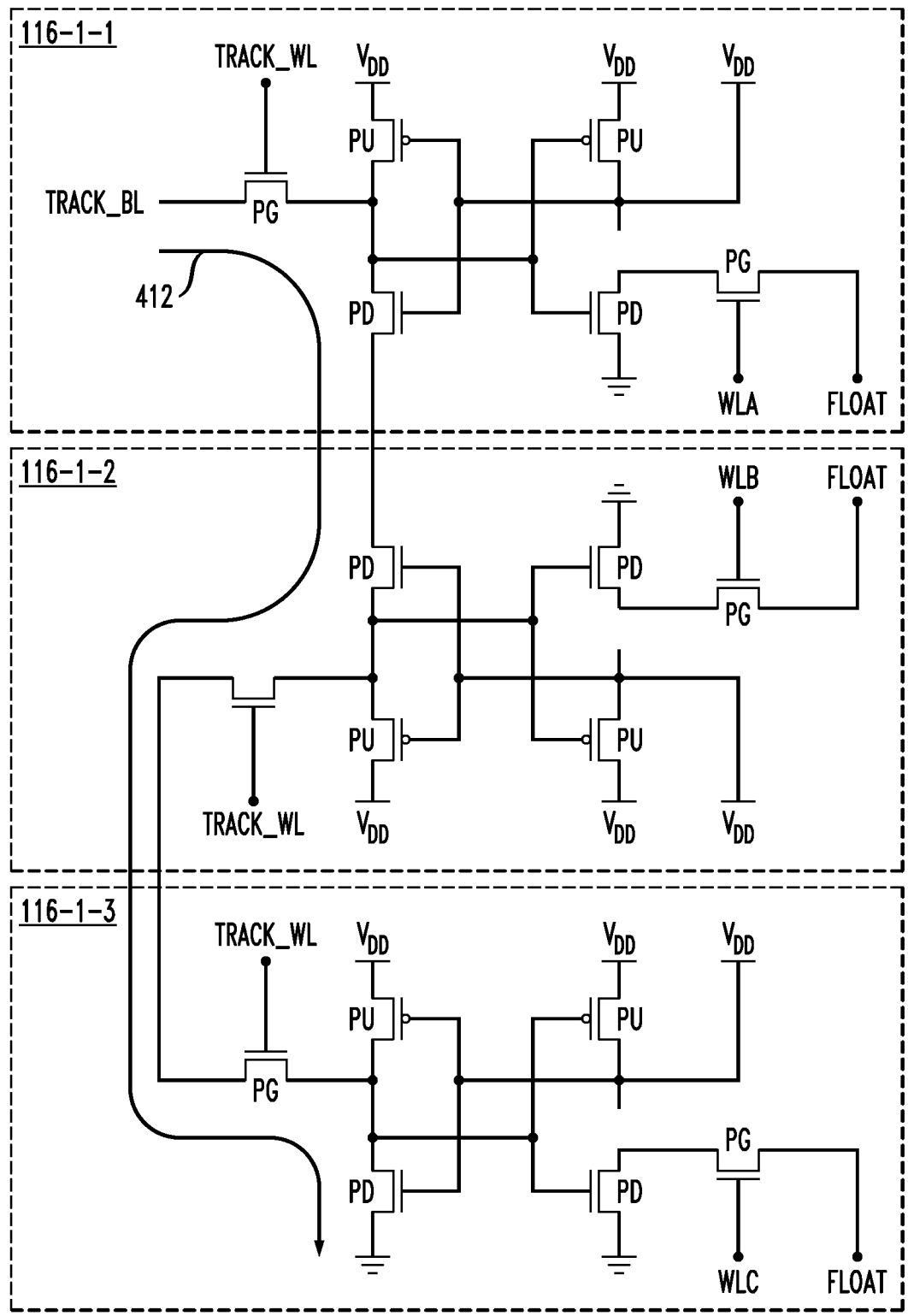
FIG. 4 is a schematic diagram that provides additional details for test cells of FIG. 2, in accordance with an exemplary embodiment.

FIG. 4 is a schematic diagram that provide additional details for test cells of FIG. 2, in accordance with an exemplary embodiment. Additional detail for test cells 116-1-1, 116-1-2, and 116-1-3 is shown in FIG. 3, with the detail similarly applicable for test cells in test cell groups 116-2 and 116-3. Each test cell in FIG. 3 may be similar to a nominal test cell in the 6T configuration as shown in FIG. 2 but with modifications that enlist certain components for timing tracking functionality, i.e., that re-purpose the test cells. As shown, each test cell may include two PG transistors, two PU transistors, and two PD transistors. Although each path in FIG. 4 is shown as including a PD transistor in each test cell in current path 412, a PU transistor may be used instead in another embodiment. This may be achieved by tying a node to ground instead of to $V_{DD}$, which forces a PMOS PU transistor into the closed ("on") state.

Each test cell in FIG. 4 includes a PG transistor that is coupled to a floating node, as denoted by FLOAT, and that has a gate coupled to a corresponding word line, as denoted by WLA, WLB, and WLC. Those word lines are disabled from accessing the test cells due to the floating node coupled to the corresponding PG transistors. The floating node in each column may be implemented by enlisting a bit line or segments of a bit line to be electrically floating. In FIG. 4, for each cell the respective drain terminals of the transistors of the one of the PU-PD pairs are shown as being disconnected. For example, in cell 116-1-1, the PU-PD pair at right does not have drain terminals connected to one another. Similar to the discussion above regarding FIG. 3, such disconnection may prevent current from flowing from $V_{DD}$ (that ties a node high to force the state of an inverter formed by the PU-PD pair at left) through the PG transistor at right in cell 116-1-1 to a bit line when WLA has a logical high value. In other embodiments, the drain terminals of the PU-PD pair at right in cell 116-1-1 are connected to one another (and similar connections are present in other test cells). Enlisting a bit line to be electrically floating (as shown by FLOAT in FIG. 4) prevents creation of a DC leakage path. Alternatively, if the bit line is not configured to be floating, a gate of a PG transistor (e.g., WLA that biases the PG transistor at right in cell 116-1-1 of FIG. 4) may be tied to ground to cut off the leakage path. Thus, configurations of both FIG. 3 and FIG. 4 may be modified to be similar to the cross-coupled inverter configuration of FIG. 2.

Figure 5:
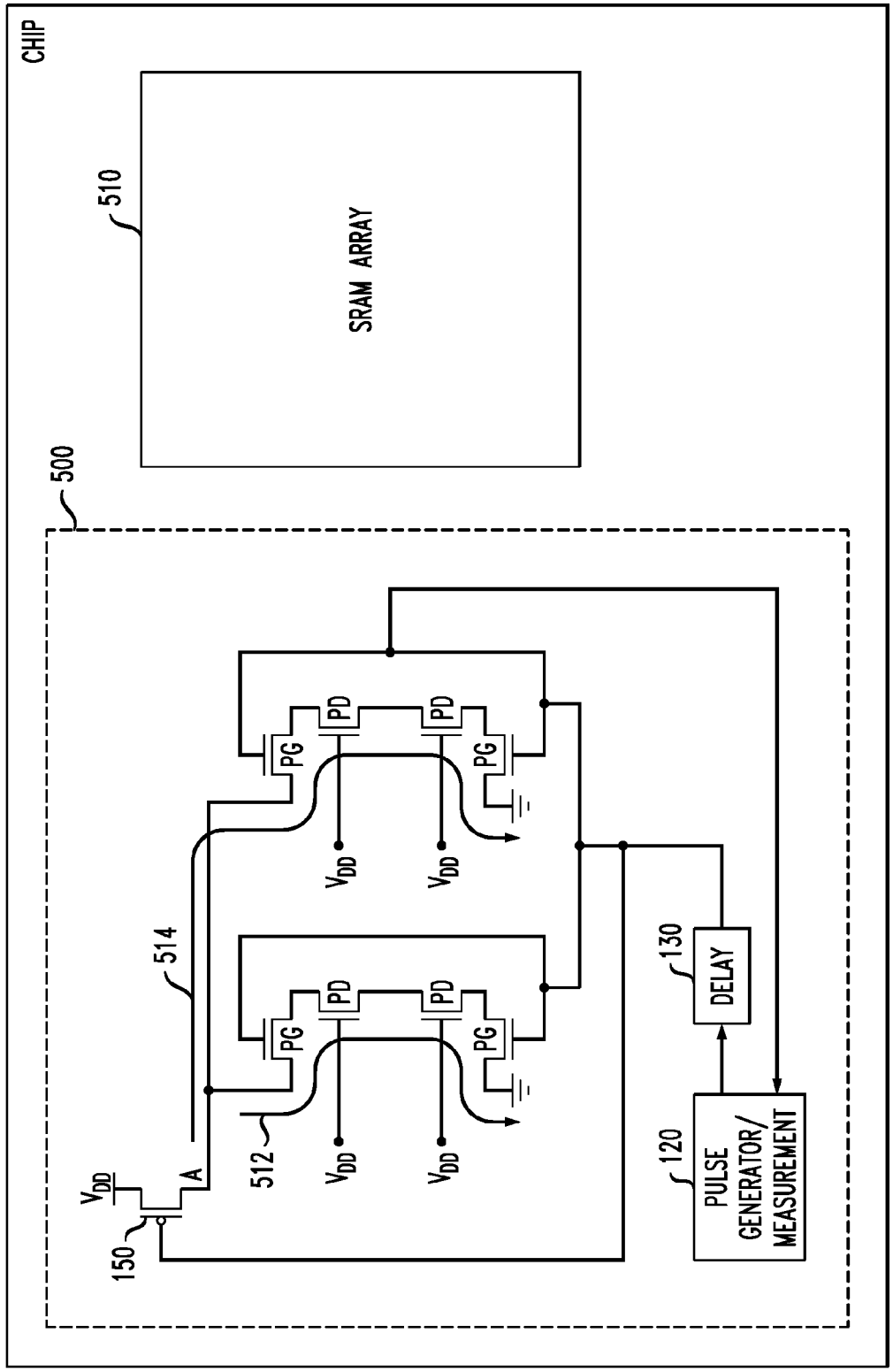
FIG. 5 is a schematic diagram of a timing tracking apparatus external to an SRAM array in accordance with an exemplary embodiment.

The embodiments shown in FIGS. 1A and 1B exemplify configurations in which test cells in each figure are themselves part of an SRAM array. Alternatively, a separate timing tracking circuit may be used, as shown in FIG. 5. The timing tracking apparatus 500 of FIG. 5 is external to an SRAM array 510. As in FIGS. 1A and 1B, the configuration in FIG. 5 includes a shunt corresponding to the parallel connections of transistors to node A. The shunt provides separate paths 512 and 514 from node A to ground. Each path includes series-connected test cells, where each test cell includes multiple transistors as in FIG. 3 or 4. The test cells are physically separated from SRAM array 510 and are located on a common chip with the SRAM array. The SRAM test apparatus 500 has a timing characteristic that emulates a timing characteristic of the SRAM array.

FIG. 6A is a flow diagram of a process in accordance with an exemplary embodiment. After process 600a begins, a first signal is generated (610) at a test signal generator, e.g., generator 120. A track node, e.g., enlisted bit line 154, is coupled (620) to a positive power supply voltage, e.g., $V_{DD}$, via a first switch, e.g., transistor 150, and the first signal is conducted (630) to the first switch. The first switch is opened (640), based on the first signal, to decouple the track node from the positive power supply voltage. Multiple static random access memory (SRAM) test cells, e.g., test cells 114, are provided (650), arranged in at least two rows and at least one column. Each test cell includes a first transistor (PG), a second transistor (PU), and a third transistor (PD). A gate of one of the PU and PD transistors of each test cell is coupled to a fixed voltage, e.g., $V_{DD}$ or $V_{SS}$, to force said one transistor into a conducting state, and at least two of the test cells, e.g., test cells 114-1-1 and 114-1-2, are connected in series. The PG transistors of the series-connected test cells are closed (660), based on the first signal, to couple the track node to a ground node via an electrical path through the series-connected test cells. The track node is coupled (670) to the signal generator, to provide a second signal to the pulse generator, and a current in said one transistor is detected (680) based on the second signal, e.g., the pulled down TRACK_BL.

FIG. 6B is a flow diagram of a process in accordance with an exemplary embodiment. After process 600b begins, a first signal is generated (610) at a test signal generator. A track node is coupled (620) to a positive power supply voltage via a first switch, and the first signal is conducted (630) to the first switch. The first switch is opened (640), based on the first signal, to decouple the track node from the positive power supply voltage. Multiple static random access memory (SRAM) test cells are provided (650). The test cells are coupled in parallel with one another. Each test cell is coupled to the track node and includes a first transistor (PG), a second transistor (PU), and a third transistor (PD). A gate of one of the PU and PD transistors of each test cell is coupled to a fixed voltage to force said one transistor into a conducting state. The PG transistors of the test cells are closed (660), based on the first signal, to conduct current from the track node through a predetermined one of the PU and PD transistors in each of the test cells. The track node is coupled to the signal generator (670), to provide a second signal to the pulse generator.

Referring back to FIGS. 3-4, the normal SRAM 6T configuration (i.e., configuration of a nominal SRAM cell) is adapted with a few modifications for timing tracking functionality. The layout changes (relative to the layout of nominal SRAM cells) that implement the test cells in the circuit schematic of FIGS. 1A, 1B, 3, and 4 are discussed below.

According to the non-limiting illustrated examples, the transistors of the nominal bit cells and the test bit cells are embodied and interconnected using various optical mask, chemical etching, epitaxial growth, abrading and other process steps to form p regions, n regions, dielectrically coupled gate regions and conductive regions, in multiple layers over which the regions overlap. The regions are connected to one another along conductors and vias extending along and between layers, according to a solid state geometric layout. It is understood by one of ordinary skill that circuit components may be formed by forming various regions and layers over a semiconductor substrate. For example, a P-well or an N-well may be formed over a substrate. Oxide diffusion (OD) regions at the surface of P or N-wells may be doped N-type or P-type and may form semiconductor active areas. Polysilicon (PO) regions disposed above P or N-wells may control flow of current between OD regions. A layer of metal typically referred to as metal-0 (M0) may be formed above OD regions, in the form of M0 oxide diffusions (M0OD). Metal-0 polysilicon (M0PO) may be provided above PO regions. Vias referred to as VIA0 (V0) vias may be provided between M0OD and a higher metal layer referred to as metal-1 (M1). Vias referred to as VIA1 (V1) vias may be provided between M1 and a higher metal layer referred to as metal-2 (M2). According to other embodiments, a contact process may be used instead of a metal-0 process. Layout modifications for a contact process may be similar to those for a metal-0 process and are described further below in the context of FIG. 13.

Figure 7:
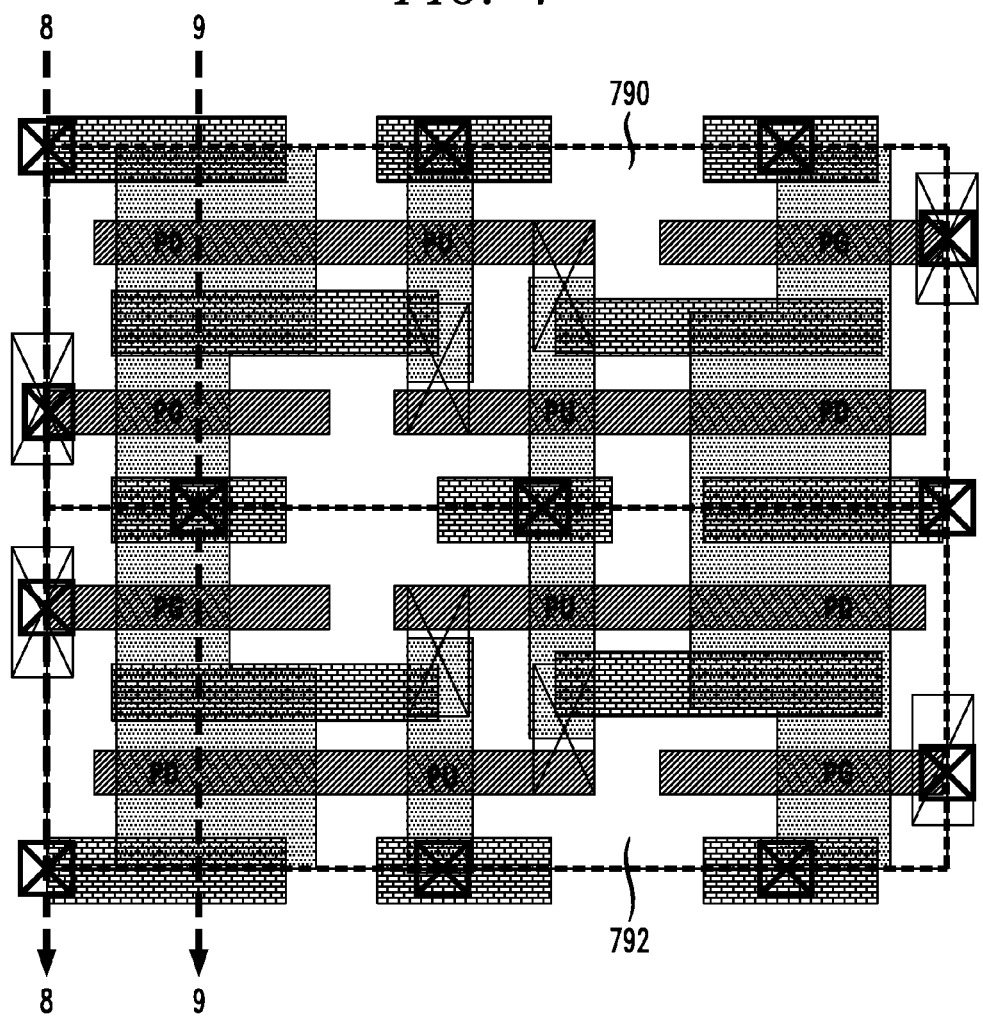
FIG. 7 is a top view (plan view) layout diagram of a layout of nominal cells.

An example layout for the nominal bit cells is shown in FIG. 7, which shows example nominal bit cells 790 and 792. The layout of regions and vias in and between adjacent layers is substantially the same in the nominal cells and in the test cells; various differences are discussed further below.

Figure 8:
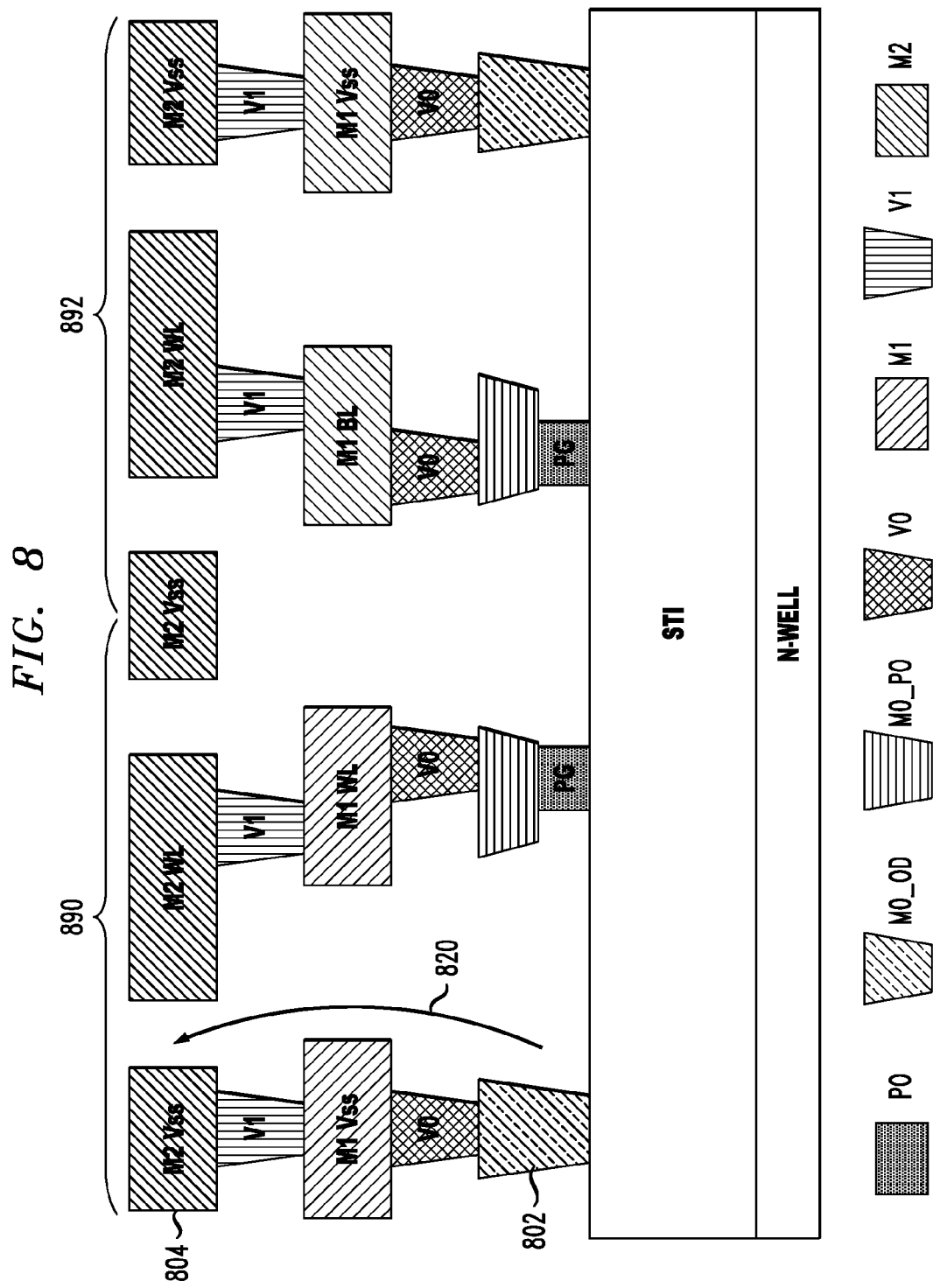
FIG. 8 is a cross-sectional view of a cell structure taken along section line 8-8 of FIG. 7.

FIG. 8 is a cross-sectional view of a cell structure taken along section line 8-8 of FIG. 7. The left and right halves of FIG. 8, marked 890 and 892, correspond to cells 790 and 792, respectively. FIG. 8 shows that the metal zero oxide diffusion (M0OD) layer, e.g., region 804, is connected (electrically coupled) to the metal two (M2)$V_{ss}$ layer, e.g., region 804. The role of the connection from M0OD to M2 VSS (shown by arrow 820) is understood with reference to FIG. 9.

Figure 9:
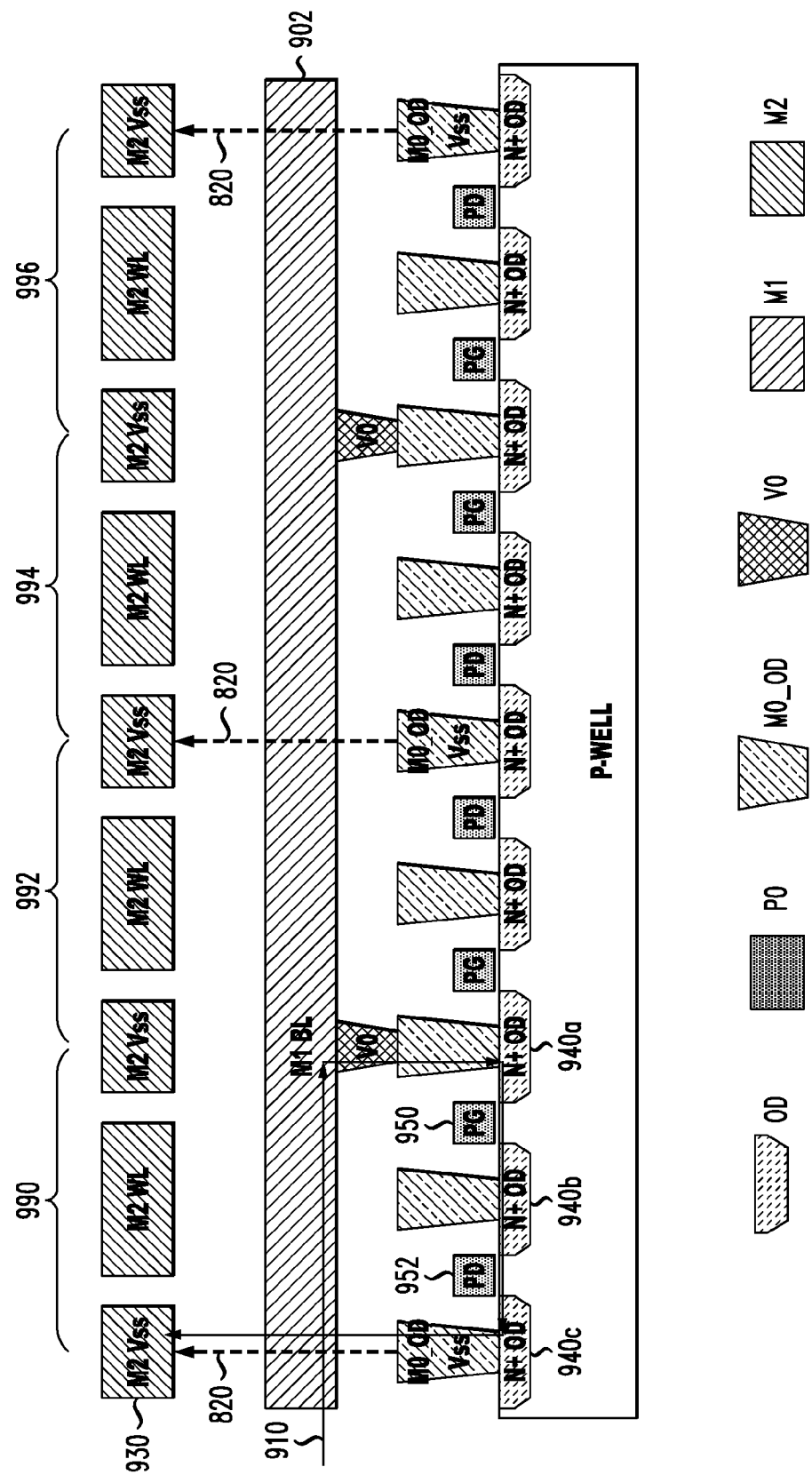
FIG. 9 is a cross-sectional view of a cell structure, the left half of which cross-section is taken along section line 9-9 of FIG. 7.

FIG. 9 is a cross-sectional view of a cell structure, the left half of which cross-section is taken along section line 9-9 of FIG. 7. In other words, the cross-sectional portions 990 and 992 correspond to cells 790 and 792, and cross-sectional portions 994 and 996 show how the layout of cells may be repeated, e.g., if another cell pair identical to cell pair 790-792 were shown below cell pair 790-792 in FIG. 7. If test cells were to have a layout with the modifications described above relative to nominal cells, then a test current for timing tracking would flow along path 910. Namely, current would flow from bit line 902 that is enlisted for TRACK_BL functionality, shown in FIG. 9 as M1 BL, through transistors represented by PG 950 and PD 952 using N+ oxide diffusions (OD's) 940*a*, 940*b*, and 940*c*, and to ground 930 (here denoted M2 Vss) along path 820 (denoted by a dashed arrow) that was shown in FIG. 8. In this example, the path from TRACK_BL to ground would be within a single cell, i.e., it would not span multiple cells.

Figure 10:
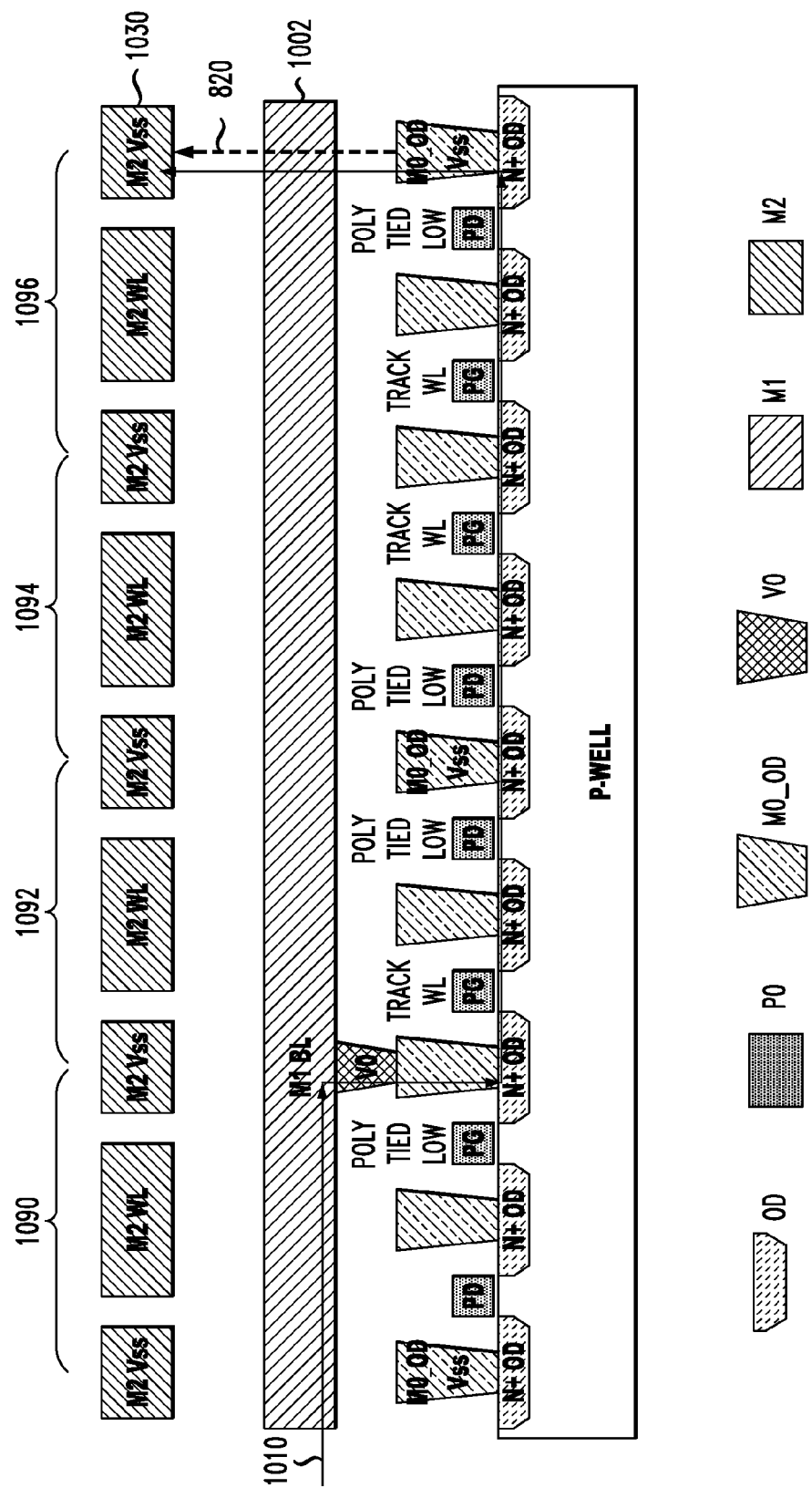
FIG. 10 is a cross-sectional view of a test cell structure with a modified layout in accordance with an exemplary embodiment.

FIG. 10 is a cross-sectional view of a test cell structure with a modified layout in accordance with an exemplary embodiment. FIG. 10 may correspond to the same cross-sectional cut as FIG. 9 but for a modified layout associated with test cells instead of for an original layout associated with nominal cells. Layout changes described further below in the context of FIGS. 13-14 may yield the cross-section of FIG. 10. FIG. 10 shows four test cells 1090, 1092, 1094, and 1096 in accordance with an embodiment, with these test cells connected in series to provide a path 1010 for current to flow from enlisted bit line 1002 (TRACK_BL) to ground 1030 (M2 $V_{ss}$). In FIG. 10, unlike in FIG. 9, the current flows across inter-cell boundaries, e.g., from an N+ OD in one cell to an N+ OD in an adjacent cell. In FIG. 10, three cell interfaces are shown (with PG-PG, PD-PD, and PG-PG connections, respectively), such that here the tracked cell current flows through a PD-PD interface and a PG-PG interface to traverse three cells. Various numbers of interfaces may be present within a current path, because various numbers of test cells may be connected in series, e.g., for the configurations in FIG. 1A or 1B. The gate connections of PD transistors to a logically high voltage (e.g., $V_{DD}$) are shown by "Poly Tied High" in FIG. 10, where "poly" stands for polysilicon (PO). Gate connections of PG transistors to TRACK_WL are also shown in FIG. 10. Additionally, a PG gate in cell 1090 may be coupled to a logically low voltage (i.e., tied low) as indicated by "Poly Tied Low" in FIG. 10 to prevent current from flowing to ground within test cell 10290 (and instead to flow to adjacent test cell 1092). At the last test cell in the series connection (i.e., the last cell along the series current path), here cell 1096, current flows from M0OD to ground as shown by dashed arrow 820. Thus, in some embodiments certain cells (test cells) have substantially similar layout as nominal cells but have certain modifications to layout that alter their functionality for timing tracking, as described above. Certain modifications that achieve the cross-section of FIG. 10 are described below in the context of FIGS. 13-14.

Figure 11:
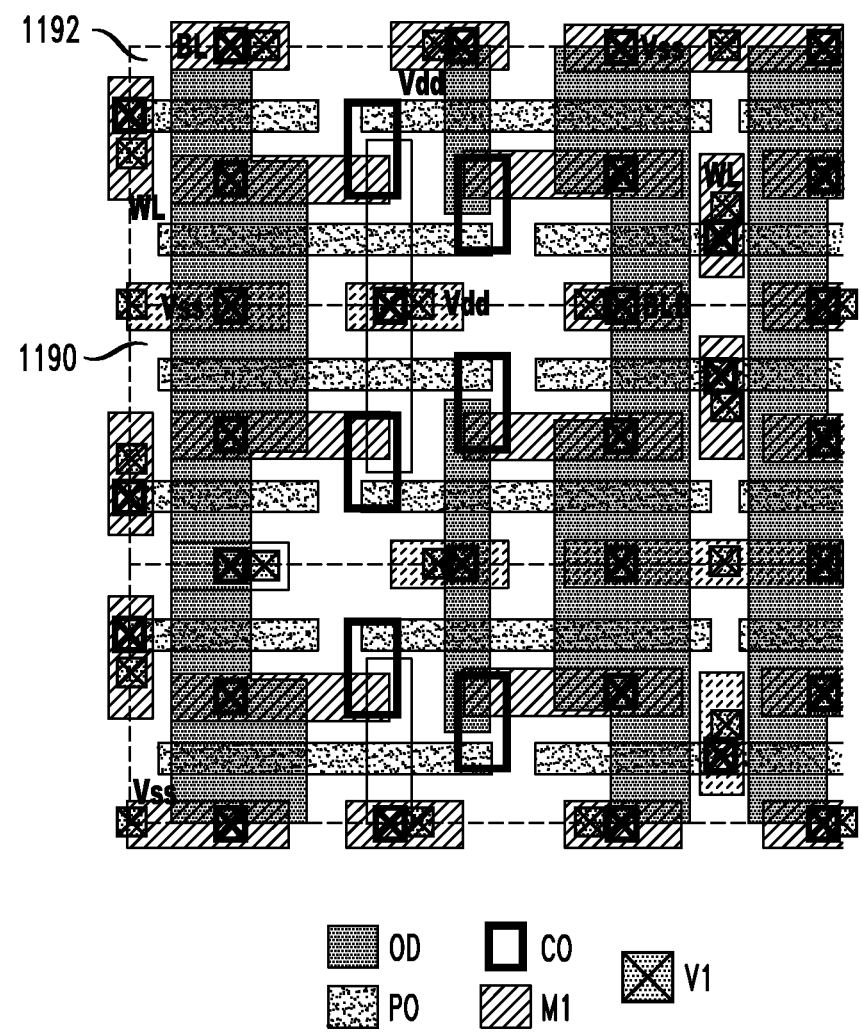
FIG. 11 is a top view (plan view) layout diagram of an example layout of nominal cells, with the orientation rotated 180 degrees relative to that of FIG. 7.
Figure 12:
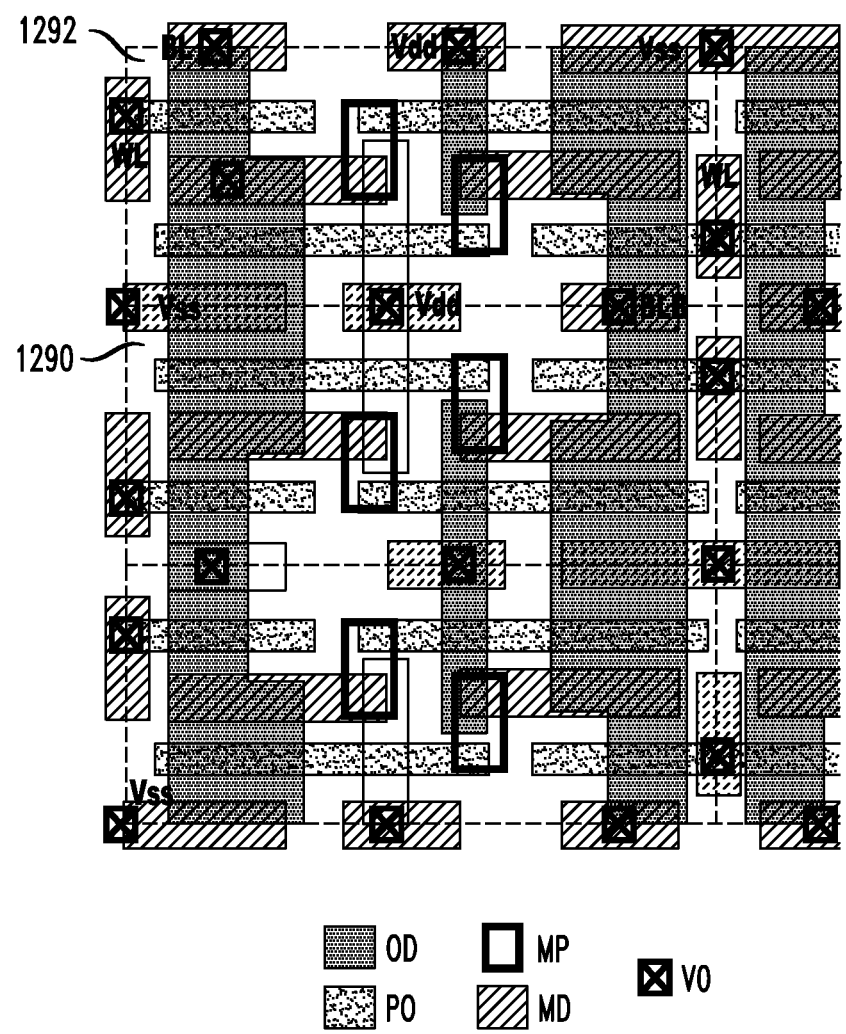
FIG. 12 is a top view (plan view) layout diagram of another example layout of nominal cells, with the orientation rotated 180 degrees relative to that of FIG. 7.

FIGS. 11 and 12 show top views (plan views) of example layouts of nominal cells, with the orientation rotated 180 degrees relative to that of FIG. 7. Layout modifications to nominal cells 1190 and 1192 of FIG. 11, and to nominal cells 1290 and 1292 of FIG. 12, to repurpose cells for timing tracking functionality are described below in the context of FIGS. 13-14.

FIG. 13 is a top (plan view) of a cell layout in accordance with an exemplary embodiment, with the orientation rotated 180 degrees relative to that of FIG. 9.

A V1 via (between M1 and M2) or a V2 via may be removed for timing tracking in some embodiments, e.g., by inserting a nonconductive region into the geometric layout at location 1301.

A V1 via from a bit line (e.g., enlisted bit line 1310 that corresponds to TRACK_BL) to M2 may be removed for timing tracking in some embodiments, e.g., by inserting a nonconductive region into the geometric layout at location 1302. Removing such vias enables a tracked test current to flow to an adjacent test cell.

A V1 via may be inserted at location 1304 to connect M1 (e.g., bit line 1320) to M2. Adding such a via stores a logical high voltage at this enlisted bit line.

Contacts 1330 provide connections between different metal layers as shown in FIG. 13. A current path from TRACK_BL to ground is shown by dashed arrow 1350.

FIG. 14 is a top (plan view) of another cell layout in accordance with an exemplary embodiment, with the orientation rotated 180 degrees relative to that of FIG. 9.

A V0 via (between M0 and M1) may be removed for timing tracking in some embodiments, e.g., by inserting a nonconductive region into the geometric layout at location 1401.

A V0 via from a bit line (e.g., enlisted bit line 1410 that corresponds to TRACK_BL) to M0 may be removed for timing tracking in some embodiments, e.g., by inserting a nonconductive region into the geometric layout at location 1402. Removing such vias enables a tracked test current to flow to an adjacent test cell.

A V1 via may be inserted at location 1404 to connect M1 (e.g., bit line 1420) to M2. Adding such a via stores a logical high voltage at this enlisted bit line.

A current path from TRACK_BL to ground is shown by dashed arrow 1450.

Either the contact process shown in FIG. 13 or the M0 process shown in FIG. 14 may be used to implement various embodiments. These processes are similar in many respects as shown in FIGS. 13-14 and as described above.

Thus, various embodiments enable device variation to be averaged out by providing timing tracking circuitry incorporating series and/or shunt features. The number of test cells in series or shunt is arbitrary and depends on the particular design adopted. Various types of timing circuit configurations may thereby be accommodated, providing flexibility to circuit designers. Embodiments thus provide efficient, flexible emulation of SRAM timing characteristics with higher accuracy than has been available previously.

Although examples are illustrated and described herein, embodiments are nevertheless not limited to the details shown, since various modifications and structural changes may be made therein by those of ordinary skill within the scope and range of equivalents of the claims.

What is claimed is:

1. A static random access memory (SRAM) test apparatus comprising:
    an array of SRAM test cells configured according to a layout with NMOS and PMOS transistors coupled as inverters and responsive to a first passing gate transistor, wherein at least one of the NMOS and PMOS transistors of a test cell at a predetermined location in the array is coupled to a fixed voltage to force a logic state of an associated inverter;
    wherein a switching signal coupled to the associated inverter through a second passing gate transistor produces a detectable test current through one of the NMOS and PMOS transistors of the associated inverter of said test cell and through one of the NMOS and PMOS transistors of an associated inverter of an adjacent test cell connected in series with the test cell.

2. The SRAM test apparatus of claim 1, wherein the array of test cells is arranged in rows and columns, and said test cell and said adjacent test cell are located in a first column;
    wherein the test current includes a first component through said one of the NMOS and PMOS transistors of the associated inverter of said test cell at the predetermined location, and a second component through one of the NMOS and PMOS transistors of an associated inverter of a test cell in a second column adjacent to said first column.

3. The SRAM test apparatus of claim 1, wherein the array of SRAM test cells is physically separated from an array of SRAM nominal bit cells and is located on a common chip with the array of nominal bit cells, whereby said SRAM test apparatus has a timing characteristic that emulates a timing characteristic of the array of nominal bit cells.

4. The SRAM test apparatus of claim 1, wherein at least one of the test cells is coupled to an array of SRAM nominal bit cells arranged in rows and columns, and said at least one SRAM test cell is located in a row or column of the array of SRAM nominal bit cells, whereby said SRAM test apparatus has a timing characteristic that emulates a timing characteristic of the array of nominal bit cells.

5. A static random access memory (SRAM) test apparatus comprising:
    an array of SRAM test cells configured according to a layout with NMOS and PMOS transistors coupled as inverters and responsive to a first passing gate transistor, wherein at least one of the NMOS and PMOS transistors of a first test cell at a predetermined location in the array is coupled to a fixed voltage to force a logic state of an associated inverter;
    wherein a switching signal coupled to the associated inverter through a second passing gate transistor produces a detectable test current having a first component through one of the NMOS and PMOS transistors of the associated inverter of said test cell, and a second component through one of the NMOS and PMOS transistors of an associated inverter of a second test cell adjacent to the first test cell in the array.

6. The SRAM test apparatus of claim 5, wherein the array of test cells is arranged in rows and columns, and each of the first and second test cells is coupled in series to a test cell in an adjacent row.

7. The SRAM test apparatus of claim 5, wherein the first and second test cells are located in a same row and in different columns.

8. The SRAM test apparatus of claim 5, wherein the array of SRAM test cells is physically separated from an array of SRAM nominal bit cells and is located on a common chip with the array of nominal bit cells, whereby said SRAM test apparatus emulates a timing characteristic of the array of nominal bit cells.

9. The SRAM test apparatus of claim 5, wherein at least one of the test cells is coupled to an array of SRAM nominal bit cells arranged in rows and columns, and said at least one test cell is located in a row or column of the array of SRAM nominal bit cells, whereby said SRAM test apparatus emulates a timing characteristic of the array of nominal bit cells in others of the rows and columns.

10. A method for configuring a test apparatus, comprising:
    generating a first signal at a test signal generator;
    coupling a track node to a positive power supply voltage via a first switch;
    conducting the first signal to the first switch;
    opening the first switch, based on the first signal, to decouple the track node from the positive power supply voltage;
    providing a plurality of static random access memory (SRAM) test cells arranged in at least two rows and at least one column, each test cell including a first transistor (PG), a second transistor (PU), and a third transistor (PD), wherein a gate of one of the PU and PD transistors of each test cell is coupled to a fixed voltage to force said one transistor into a conducting state, and at least two of the test cells are connected in series,
    closing the PG transistors of the series-connected test cells, based on the first signal, to couple the track node to a ground node via an electrical path through the series-connected test cells;
    coupling the track node to the signal generator, to provide a second signal to the pulse generator; and
    detecting a current in said one transistor based on the second signal.

11. The method of claim 10, wherein providing the plurality of test cells includes providing a first test cell and a second test cell coupled in parallel with one another, the method further including conducting a first current and a second current through the PG transistors of the first and second test cells, respectively.

12. The method of claim 10, wherein the plurality of SRAM test cells are physically separated from an SRAM array of bit cells and are located on a common chip as the SRAM array, the method further including monitoring an arrival time of the second signal at the pulse generator to determine a timing characteristic of the SRAM array.

13. The method of claim 10, further comprising providing a plurality of SRAM bit cells in an array, the bit cells arranged in a pattern having multiple word lines and bit lines meeting at the bit cells and operated for selecting a given cell by concurrently activating a word line and a bit line coupled to said given cell, the SRAM cells including nominal cells and said plurality of test cells, wherein a first bit line and a second bit line in the pattern are enlisted for testing a propagation time between selecting at least one test cell and sensing of the second signal, wherein said first and second enlisted bit lines are disabled for random access to the bit cells, and wherein at least one test cell is coupled to at least one nominal cell.

14. The method of claim 13, wherein each nominal cell comprises a pair of CMOS inverters cross coupled between two nodes and operationally determining a logic state, and a pair of access transistors that couple associated bit line signals and word line signals to the nominal cell for one of reading and changing the logic state, each nominal cell including a first transistor (PG1), a second transistor (PU1), a third transistor (PD1), a fourth transistor (PG2), a fifth transistor (PU2), and a sixth transistor (PD2); wherein PU1 with PD1 and PU2 with PD2 form the CMOS inverters and have gates coupled to one of the nodes and a junction at an output coupled to an other of the nodes, the nodes respectively being normally floating and coupled through PG1 and PG2 to complementary said associated bit line signals when enabled by the word line signals;

wherein the transistors of the nominal bit cells and the test bit cells are formed by p regions, n regions, dielectrically coupled gate regions and conductive regions, in multiple layers over which said regions overlap and are connected to one another along conductors and vias extending along and between layers, according to a solid state geometric layout;

wherein said layout of regions and vias in and between adjacent layers is substantially the same in the nominal cells and in the test cells;

the method further comprising inserting a nonconductive region into said geometric layout at a via extending between two of the layers, to enable current to flow between at least two adjacent test cells.

15. The method of claim 14, further comprising inserting a via between two of the layers, to couple a conductor at one of the layers to a third bit line enlisted for logic state maintenance.

16. A method comprising:
generating a first signal at a test signal generator;
coupling a track node to a positive power supply voltage via a first switch;
conducting the first signal to the first switch;
opening the first switch, based on the first signal, to decouple the track node from the positive power supply voltage;
providing a plurality of static random access memory (SRAM) test cells coupled in parallel with one another, each test cell coupled to the track node, each test cell including a first transistor (PG), a second transistor (PU), and a third transistor (PD), wherein a gate of one of the PU and PD transistors of each test cell is coupled to a fixed voltage to force said one transistor into a conducting state;

closing the PG transistors of the test cells, based on the first signal, to conduct current from the track node through a predetermined one of the PU and PD transistors in each of the test cells; and
coupling the track node to the signal generator, to provide a second signal to the pulse generator.

17. The method of claim 16, wherein the plurality of SRAM test cells are physically separated from an SRAM array of bit cells and are located on a common chip as the SRAM array, the method further including monitoring an arrival time of the second signal at the pulse generator to determine a timing characteristic of the SRAM array.

18. The method of claim 16, further comprising providing a plurality of SRAM bit cells in an array, the bit cells arranged in a pattern having multiple word lines and bit lines meeting at the bit cells and operated for selecting a given cell by concurrently activating a word line and a bit line coupled to said given cell, the SRAM cells including nominal cells and said plurality of test cells, wherein a first bit line and a second bit line in the pattern are enlisted for testing a propagation time between selecting at least one test cell and sensing of the second signal, wherein said first and second enlisted bit lines are disabled for random access to the bit cells, and wherein at least one test cell is coupled to at least one nominal cell.

19. The method of claim 18, wherein each nominal cell comprises a pair of CMOS inverters cross coupled between two nodes and operationally determining a logic state, and a pair of access transistors that couple associated bit line signals and word line signals to the nominal cell for one of reading and changing the logic state, each nominal cell including a first transistor (PG1), a second transistor (PU1), a third transistor (PD1), a fourth transistor (PG2), a fifth transistor (PU2), and a sixth transistor (PD2); wherein PU1 with PD1 and PU2 with PD2 form the CMOS inverters and have gates coupled to one of the nodes and a junction at an output coupled to an other of the nodes, the nodes respectively being normally floating and coupled through PG1 and PG2 to complementary said associated bit line signals when enabled by the word line signals;

wherein the transistors of the nominal bit cells and the test bit cells are formed by p regions, n regions, dielectrically coupled gate regions and conductive regions, in multiple layers over which said regions overlap and are connected to one another along conductors and vias extending along and between layers, according to a solid state geometric layout;

wherein said layout of regions and vias in and between adjacent layers is substantially the same in the nominal cells and in the test cells;

the method further comprising inserting a nonconductive region into said geometric layout at a via extending between two of the layers, to enable current to flow between at least two adjacent test cells.

20. The method of claim 19, further comprising inserting a via between two of the layers, to couple a conductor at one of the layers to a third bit line enlisted for logic state maintenance.

* * * * *